(12) United States Patent
Kennedy et al.

(10) Patent No.: US 9,103,015 B2
(45) Date of Patent: Aug. 11, 2015

(54) SLIDING ELEMENT AND METHOD FOR COATING A SLIDING ELEMENT

(75) Inventors: Marcus Kennedy, Dusseldorf (DE); Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 122 days.

(21) Appl. No.: 13/583,690

(22) PCT Filed: Feb. 17, 2011

(86) PCT No.: PCT/EP2011/052345
§ 371 (c)(1), (2), (4) Date: Sep. 10, 2012

(87) PCT Pub. No.: WO2011/110413
PCT Pub. Date: Sep. 15, 2011

(65) Prior Publication Data
US 2013/0004756 A1    Jan. 3, 2013

(30) Foreign Application Priority Data
Mar. 9, 2010  (DE) .......................... 10 2010 002 686

(51) Int. Cl.
*C23C 16/00* (2006.01)
*C23C 14/06* (2006.01)
(Continued)

(52) U.S. Cl.
CPC ......... *C23C 14/0605* (2013.01); *C23C 14/0641* (2013.01); *C23C 16/26* (2013.01); *C23C 28/044* (2013.01); *C23C 28/046* (2013.01); *C23C 28/42* (2013.01); *C23C 30/005* (2013.01); *F16J 9/26* (2013.01); *Y10T 428/24975* (2015.01);
(Continued)

(58) Field of Classification Search
CPC ........ C23C 16/26; C23C 28/00; C23C 28/04; C23C 30/005; C23C 14/605; C23C 14/0641; F16J 9/26
USPC ........... 277/442; 427/249.6, 255.23, 255.493, 427/577; 428/216, 217, 336, 408, 698, 715
See application file for complete search history.

(56) References Cited

U.S. PATENT DOCUMENTS 4,619,865 A * 10/1986 Keem et al. ................... 428/698
4,707,384 A * 11/1987 Schachner et al. ....... 427/249.14
(Continued)

FOREIGN PATENT DOCUMENTS

DE    102005063123 B3    5/2007
DE    102008016864 B3    10/2009
(Continued)

OTHER PUBLICATIONS

Weber et al., "Hochbelastbare kohlenstoffbasierte Mehrschichtsysteme fur die Umformtechnik," Vakuum in Forschung und Praxis 18 (2006) Nr. 3, Wiley-VCH Verlag GmbH & Co. KGaA, Weinheim.
(Continued)

*Primary Examiner* — Archene Turner
(74) *Attorney, Agent, or Firm* — Robert L. Stearns; Dickinson Wright, PLLC

(57) ABSTRACT

A sliding element, in particular a piston ring, preferably made of cast iron or steel, has a coating which has a plurality of layers of CrN (14) and a-C:H:Me coatings (16) alternately. In a method for coating the sliding element, in particular a piston ring, preferably made of cast iron or steel, a plurality of layers of CrN and a-C:H:Me coatings are applied alternately.

21 Claims, 1 Drawing Sheet

(51) Int. Cl.
*C23C 16/26* (2006.01)
*C23C 30/00* (2006.01)
*F16J 9/26* (2006.01)
*C23C 28/04* (2006.01)
*C23C 28/00* (2006.01)

(52) U.S. Cl.
CPC ...... *Y10T428/24983* (2015.01); *Y10T 428/264* (2015.01); *Y10T 428/265* (2015.01); *Y10T 428/31678* (2015.04)

(56) References Cited

U.S. PATENT DOCUMENTS

| | | | |
|---|---|---|---|
| 6,372,303 | B1 * | 4/2002 | Burger et al. ............... 427/249.1 |
| 6,599,400 | B2 * | 7/2003 | Strondl et al. ........... 204/192.15 |
| 7,169,479 | B2 | 1/2007 | Schuhmacher et al. |
| 7,947,372 | B2 * | 5/2011 | Dekempeneer ............... 428/408 |
| 8,033,550 | B2 * | 10/2011 | Jacquet et al. ................. 277/442 |
| 8,178,213 | B2 * | 5/2012 | Werger ......................... 428/408 |
| 8,641,046 | B2 * | 2/2014 | Hoppe et al. ................. 428/408 |
| 2001/0028926 | A1 | 10/2001 | Strondl et al. |
| 2005/0175837 | A1 | 8/2005 | Massler et al. |
| 2008/0220257 | A1 | 9/2008 | Dekempeneer |
| 2009/0001669 | A1 | 1/2009 | Hoppe et al. |
| 2010/0044968 | A1 | 2/2010 | Fischer et al. |
| 2011/0101620 | A1 | 5/2011 | Hoppe et al. |

FOREIGN PATENT DOCUMENTS

| | | | |
|---|---|---|---|
| JP | 10-237627 | * | 9/1998 |
| JP | 11-100671 | * | 4/1999 |
| JP | 2000064097 | A | 2/2000 |
| JP | 2000237627 | A | 9/2000 |
| JP | 2001288559 | A | 10/2001 |
| JP | 2003014121 | A | 1/2003 |
| JP | 2003247060 | A | 9/2003 |
| JP | 2008286354 | A | 11/2008 |
| JP | 2009504448 | A | 2/2009 |
| RU | 2156370 | C1 | 9/2000 |
| RU | 2288297 | C2 | 11/2006 |
| WO | 9825017 | A1 | 6/1998 |
| WO | 9858100 | A1 | 12/1998 |
| WO | 2006125683 | A1 | 11/2006 |
| WO | 2009121719 | A2 | 10/2009 |

OTHER PUBLICATIONS

Beschichten mittels Sputterverfahren, Section 2.1.5.7, Diener electronic GmbH, http://www.plasma.de/de/plasma_wissenswertes/plasma_system_7.html, visited Sep. 27, 2010.

Schultrich et al., Tribologisches Verhalten von amorphen Kohlemstoffschichten, Europasche Forschungsgesellschaft Dunne Schichten e.V. -EFDS-; Fraunhofer-Institut fur Schicht-und Oberflachentechnik -IST, Braunschweig; Fraunhofer-Institut for Werkstoff- und Strahltechnik -IWS-, Dresden: Kohlenstoffschichten—tribologische Eigenschaften und Verfahren zu ihrer Herstellung: Am Jun. 8, 2006 in Dortmund.

Pal S K et al., "Effects of N-doping on the microstructure, mechanical and tribological behavior or CR-DLC films," Surface and Coatings Technology, Elsevier, Amsterdam, NL, vol. 201, Nr. 18, Jun. 25, 2007, pp. 7917-7923. See Summary; pp. 7917-7918, 7920, paragraph 3.2—p. 7921; p. 7923, paragraph 4.

* cited by examiner

SLIDING ELEMENT AND METHOD FOR COATING A SLIDING ELEMENT

BACKGROUND OF THE INVENTION

1. Technical Field

The invention relates to a sliding element, in particular a piston ring, having a coating, and to a method for coating a sliding element.

2. Related Art

In many technical applications, sliding elements are in sliding contact with sliding contact surfaces. The combination of a piston ring with a cylinder liner can be seen as a typical application. Provided that the cylinders or cylinder liners are made, for example, of aluminium-silicon alloys, which is the case in particular with Otto engines, DLC (diamond-like carbon) coating systems have proved to be successful as regards wear and friction power. However, the known DLC coating systems are in need of improvement as regards lifetime and their usability in diesel or turbocharged Otto engines with conventionally iron-based cylinder liners. Because of the significantly higher cylinder pressures and in particular in combination with direct injection, an increased proportion of mixed friction occurs. The definitive reason for the lack of suitability of DLC coating systems for such situations is seen as being the conventionally small layer thickness of less than 5 µm.

DE 10 2005 063 123 B3 discloses a DLC coating with a running-in layer. With regard to greater layer thicknesses, there are also known PVD coatings, in particular based on CrN, which have layer thicknesses in the range of from 10 to 30 µm. Although these result in an improved lifetime, the friction power and wear resistance, in particular in conditions of insufficient lubrication, and the scuff resistance are impaired. By contrast, DLC coating systems offer the advantage, owing to their amorphous structure, that they exhibit a large degree of chemical inactivity with metal surfaces and accordingly an extremely low adhesive tendency towards the sliding contact surface.

This is true, for example, of the coating according to DE 10 2008 016 864 B3, which has on the inside a metal-containing amorphous carbon layer and on the outside a metal-free amorphous carbon layer.

SUMMARY OF THE INVENTION

The object underlying the invention is to provide a sliding element, in particular a piston ring, which meets the demands that are made in terms of lifetime and friction power in particular when used in diesel or turbocharged Otto engines with, for example, iron-based sliding contact surfaces. A method for coating a sliding element is further to be provided.

The coating provided thereon is distinguished by a plurality of alternating plies of CrN and a-C:H:Me layers. Initial tests have shown that both the lifetime and the relative coefficient of friction can be improved by such a layer structure.

For the sake of clarity it is mentioned that Me represents metal, and tungsten, chromium, titanium or silicon, for example, can be used therefor. Both the a-C:H:Me and the a-C:H layer mentioned below are DLC layers and ensure comparatively low wear and good friction properties. In particular, it is assumed that, due to different radial contact pressures and different rates of wear produced thereby, for example over the circumference of a piston ring, DLC is nevertheless always present at least on part of the ring surface, so that the good friction properties, in particular even under conditions of insufficient lubrication, are retained. This is combined in an advantageous manner with advantages offered by the CrN layer as regards wear. The wear resistance of the CrN layer, which is conventionally higher compared with that of DLC, can advantageously become effective from the outset, or when the outermost DLC layer is worn. The multi-ply coating described additionally offers the advantage that significantly higher overall layer thicknesses can be produced than in the case of conventional DLC coating systems. This is based essentially on the fact that the internal stresses, which are higher in the case of DLC as compared with CrN, can be equalised in the coating as a whole by the CrN plies.

The coating can in particular be provided at least in regions on at least one running surface. Furthermore, the coating can extend into the transition to surfaces and onto surfaces that are adjacent to the running surfaces. This affects, for example, the running flanks of a piston ring. It should further be mentioned that the applicant filed on the same day an application having the title "Helical compression spring for an oil scraper ring of a piston in an internal combustion engine, and method for coating a helical compression spring", in which a coating similar to that described herein is provided for a helical compression spring. All the features of the coating described therein are also applicable to the coating described herein. Furthermore, the helical compression spring described in the mentioned application can advantageously be combined in one of the embodiments described therein with the piston ring described herein and is to be regarded in that combination as a subject of the present application. Furthermore, the applicant filed on the same day an application having the title "Method for coating at least the inner face of a piston ring, and piston ring". All the measures described therein which relate in particular to the coating of the inner face of the piston ring can be applied to the piston ring described herein, and the method described in the mentioned application can in particular also be applied to the coating of surfaces other than the inner face.

Preferred further developments are described in the further claims.

For the adhesion of the CrN layer to the substrate, that is to say the sliding element, in particular a piston ring, preferably made of cast iron or steel, it has been found to be advantageous to form an adhesive layer of chromium. This can in particular be applied by vapour deposition and preferably has a layer thickness of less than 1.0 µm. 0.01 µm is at present preferred as the minimum layer thickness of the adhesive layer.

In particular with the above-described adhesive layer, it is at present preferred to choose a CrN layer as the innermost layer of the above-described multi-ply structure.

For the outermost layer of the sliding element according to the invention, which is initially in sliding contact with the sliding contact surface, a metal-free DEC layer, in other words a layer of type a-C:H, is preferred. Such a layer ensures the best possible running-in behaviour. From 0.1 to 5.0 µm has been found to be advantageous as the thickness of this layer. The minimum layer thickness of 0.1 µm is advantageous for good running-in behaviour. The maximum layer thickness is given on the basis of the minimum adhesion, which becomes lower with thicker layers. For the described outermost or top layer, application to both a CrN and an a-C:H:Me layer is conceivable.

For the individual plies of the CrN and a-C:H:Me layer, from 50 nm to 400 nm is preferred. A thickness of more than 50 nm offers the advantage that, when used in series, the testability of the layer structure is ensured.

The overall thickness of the coating is advantageously from 2 to 40 µm, in order to ensure good friction behaviour with a good lifetime. In this connection, the number of individual plies can be, for example, from 10 to 400.

For the hardness of the CrN layer, values of from 800 to 1900 HV 0.002 have been found to be suitable. This form can be combined with a hardness of the metal-free DLC layer of from 1700 to 2900 HV 0.002 and/or a hardness of the metal-containing DLC layer of from 800 to 1600 HV 0.002.

It is further expected that particularly good properties of the DLC layer, in particular of the metal-containing and/or metal-free DLC layer, will be obtained when that layer contains hydrogen.

The metal-containing DLC layer can further advantageously contain nanocrystalline metal carbide depositions, such as, for example, WC, CrC, SiC, GeC or TiC.

The object mentioned above is further achieved by the method described in claim 9.

Advantageously, the described coating can be produced within the context of the method according to the invention by a combination of sputtering and PA-CVD processes.

There is further disclosed a combination of at least one sliding element described above with a sliding contact surface, in particular a cylinder or a cylinder liner of an internal combustion engine, in particular of a diesel or turbocharged Otto engine, wherein the sliding contact surface is iron-based.

BRIEF DESCRIPTION OF THE DRAWINGS

A preferred exemplary embodiment of the invention is explained in greater detail below with reference to the drawings, in which.

DETAILED DESCRIPTION OF A PREFERRED EXEMPLARY EMBODIMENT OF THE INVENTION

Figure 1:
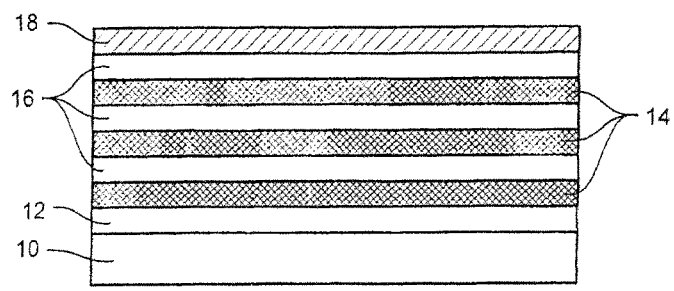
FIG. 1 shows a layer structure according to the invention.

As is apparent from FIG. 1, there is first applied to the base material 10 of the sliding element a chromium adhesive layer 12. A plurality of CrN layers 14 and a-C:H:Me layers 16 are applied alternately thereto from the inside outwards. The outermost layer 18 is formed by an a-C:H layer. In the example shown, that layer is applied to a DLC layer, but it can equally be applied to a CrN layer.

Using such a structure, tests were carried out with comparison examples. The table shows the layer systems used.

| Variant | | Layer structure | | | |
|---|---|---|---|---|---|
| | | Substrate Adhesive layer | ← Base layer | → Intermediate layer | Running surface Top layer |
| A | Uncoated | — | — | — | — |
| B | DLC double layer 01 | Cr | — | | a-C:H-01 |
| C | DLC double layer 02 | Cr | — | Me(CN)x | a-C:H-02 |
| D | DLC double layer 03 | Cr | CrN | Cr | a-C:H |
| E | Multilayer DLC | Cr | CrN/a-C:H:W alternating | | a-C:H |

Figure 2:
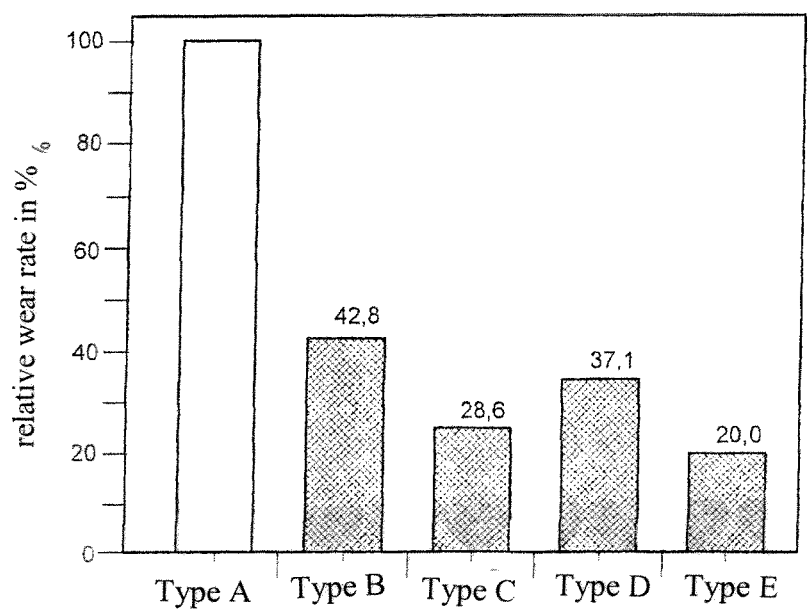
FIG. 2 shows the relative wear of a piston ring with different coatings.

These coating systems were applied to a piston ring, and the tribological behaviour was studied in combination with a honed grey cast iron cylinder liner under conditions of lubrication. The coating system that exhibits the greatest wear is defined as 100%. It is clear from FIG. 2 on the one hand that the wear is reduced by more than 50% by a DLC coating as compared with an uncoated surface. The coating system according to the invention (type E) exhibits the lowest relative wear. According to initial findings, this is achieved by the more stable structure of the multilayer system and the resulting optimised friction and wear behaviour.

The invention claimed is:

1. A piston ring having a substrate and a coating applied to the substrate which exhibits a plurality of alternating plies of CrN layers and a-C:H:Me layers, wherein Me is a metal selected from the group consisting of tungsten, chromium, and titanium, and wherein the coating includes an outermost layer of a-C:H.

2. The piston ring according to claim 1, including an adhesive layer of chromium applied to the substrate of the sliding element.

3. The piston ring according to claim 2, wherein the adhesive layer of chrome is from 0.01 to 1.0 µm thick.

4. The piston ring according to claim 1, wherein the innermost of the alternating plies is a CrN layer.

5. The piston ring according to claim 1, wherein the CrN and a-C:H:Me plies each have a thickness of from 50 nm to 400 nm.

6. The piston ring according to claim 5, wherein the CrN or a-C:H:Me plies each have a thickness form 50 nm to 400 nm.

7. The piston ring according to claim 1, wherein the coating overall has a thickness of from 2 to 40 µm.

8. The piston ring according to claim 1, wherein the hardness of the CrN layer is from 800 to 1900 HV 0.002.

9. The piston ring according to claim 1, wherein the a-C:H:Me layer is produced by metallic vapor deposition.

10. The piston ring according to claim 1, wherein the substrate of the piston ring is made of cast iron or steel.

11. The piston ring according to claim 1, wherein the outermost a-C:H:Me layer has a thickness of from 0.1 to 5.0 µm.

12. The piston ring according to claim 1 wherein the hardness of the a-C:H layer is from 1700 to 2900 HV 0.002.

13. The piston ring according to claim 1 wherein the hardness of the a-C:H:Me layer is from 800 to 1600 HV 0.002.

14. The piston ring according to claim 1 wherein the a-C:H layer is produced by PA-CVD.

15. The piston ring according to claim 1 wherein the a-C:H:Me layer is produced by PA-CVD.

16. The piston ring according to claim 1 wherein the CrN layers consist essentially of CrN.

17. The piston ring according to claim 1 wherein the a-C:H:Me layers consist essentially of a-C:H:Me and optionally nanocrystalline carbide depositions.

18. A method for coating a piston ring, in which a plurality of plies of CrN and a-C:H:Me layers are applied alternately, wherein Me is a metal selected from the group consisting of tungsten, chromium, and titanium, and an a-C:H layer is applied as an outermost layer.

19. The method according to claim 18, wherein the coating is produced by a combination of sputtering and PA-CVD.

20. The method according to claim 18 including applying an adhesive layer of chromium to the substrate of the sliding element before applying the CrN and a-C:H:Me layers.

21. The method of claim 18, wherein the substrate is made of cast iron or steel.

* * * * *